United States Patent [19]

Cole, Jr. et al.

[11] Patent Number: 5,073,814
[45] Date of Patent: Dec. 17, 1991

[54] MULTI-SUBLAYER DIELECTRIC LAYERS

[75] Inventors: Herbert S. Cole, Jr., Scotia; Yung S. Liu, Schenectady, both of N.Y.

[73] Assignee: General Electric Company, Schenectady, N.Y.

[21] Appl. No.: 546,960

[22] Filed: Jul. 2, 1990

[51] Int. Cl.[5] .................. H01L 29/34; H01L 23/48
[52] U.S. Cl. .................................. 357/54; 357/52; 357/71
[58] Field of Search ........................ 357/52, 54, 71

[56] References Cited

U.S. PATENT DOCUMENTS

| 4,827,325 | 5/1989 | Orbach et al. | 357/54 |
| 4,933,738 | 6/1990 | Orbach et al. | 357/51 |

OTHER PUBLICATIONS

S. M. Sze, *Semiconductor Devices Physics and Technology*, John Wiley & Sons, New York (1985), pp. 344, 472.
An eight page data sheet entitled "Teflon AF Amorphous Fluoropolymer", dated 01/19/90 from DuPont.

*Primary Examiner*—J. Carroll
*Attorney, Agent, or Firm*—Marvin Snyder; James C. Davis, Jr.

[57] ABSTRACT

A dielectric layer comprising a plurality of sublayers of alternating composition can provide a reduced dielectric constant while providing the adhesion and laser drilling properties of a higher dielectric constant material. Such multi-sublayer dielectric layers may be formed in situ on a high density interconnect structure or may be laminated thereon after their own formation.

28 Claims, 6 Drawing Sheets

MULTI-SUBLAYER DIELECTRIC LAYERS

This invention was made with Government support under Contract N00014-85-C-0890 awarded by the Department of the Navy. The Government has certain rights in this invention.

RELATED APPLICATIONS

This application is related to application Ser. No. 07/546,943, filed July 2, 1990 and entitled "Multiple Lamination High Density Interconnect Process and Structure Employing Thermoplastic Adhesives Having Sequentially Decreasing $T_g$'s" by H. S. Cole, Jr. et al. and application Ser. No. 07/546,964, filed July 2, 1990 and entitled "High Temperature Polyether Imide Compositions and Method of Making" by J. H. Lupinski et al., each of which is incorporated herein by reference in its entirety.

BACKGROUND OF THE INVENTION

1. Field of the Invention

The present invention relates to the field of high density interconnect structures for interconnecting electronic components, and more particularly, to such structures intended for high frequency operation.

2. Background Information

A high density interconnect (HDI) structure or system which has been developed by General Electric Company offers many advantages in the compact assembly of electronic systems. For example, an electronic system such as a micro computer which incorporates 30–50 chips can be fully assembled and interconnected on a single substrate which is 2 inch long by 2 inch wide by 0.050 inch thick. Even more important, this interconnect structure can be disassembled for repair or replacement of a faulty component and then reassembled without significant risk to the good components incorporated within the system. This repairability is a substantial advance over prior connection systems in which reworking the system to replace damaged components was either impossible or involved substantial risk to the good components.

Briefly, in this high density interconnect structure, a ceramic substrate such as alumina which may be 100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the portion of the substrate which surrounds the cavity. The bottom of the cavity is then provided with a thermoplastic adhesive layer which may preferably be polyetherimide resin available under the trade name ULTEM ® 6000 from the General Electric Company. The various components are then placed in their desired locations within the cavity, the entire structure is heated to about 300° C. which is above the softening point of the ULTEM ® polyetherimide (which is in the vicinity of 235° C.) and then cooled to thermoplastically bond the individual components to the substrate. Thereafter, a polyimide film which may be Kapton ® polyimide, available from E. I. du Pont de Nemours Company, which is $\approx 0.0005$–$0.003$ inch ($\approx 12.5$–$75$ microns) thick is pretreated to promote adhesion by reactive ion etching (RIE), the substrate and chips are then coated with ULTEM ® 1000 polyetherimide resin or another thermoplastic and the Kapton film is laminated across the top of the chips, any other components and the substrate with the ULTEM ® resin serving as a thermoplastic adhesive to hold the Kapton ® in place. Thereafter, via holes are provided (preferably by laser drilling) in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the Patents and Applications which are listed hereinafter.

This high density interconnect structure provides many advantages. Included among these are the lightest weight and smallest volume packaging of such an electronic system presently available. A further, and possibly more significant advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling. This milling process is straightforward and fairly rapid with the result that once a desired configuration for the substrate has been established, a corresponding physical substrate can be made ready for the mounting of the semiconductor chips in as little as 1 day and typically 4 hours for small quantities as are suitable for research or prototype systems to confirm the design prior to quantity production.

The process of designing an interconnection pattern for interconnecting all of the chips and components of an electronic system on a single high density interconnect substrate normally takes somewhere between one week and five weeks. Once that interconnect structure has been defined, assembly of the system on the substrate may begin. First, the chips are mounted on the substrate and the overlay structure is built-up on top of the chips and substrate, one layer at a time. Typically, the entire process can be finished in one day and in the event of a high priority rush, could be completed in four hours. Consequently, this high density interconnect structure not only results in a substantially lighter weight and more compact package for an electronic system, but enables a prototype of the system to be fabricated and tested in a much shorter time than is required with other packaging techniques.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive, Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sept. 27, 1989, entitled "Method and Apparatus for Removing Components Bonded to a Substrate" by R. J. Wojnarowski, et al.; U.S. Pat. No. 4,894,115, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. Pat. No. 4,878,991, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al. and now abandoned; U.S. patent application Ser. No. 250,010, filed Sept. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. Pat. No. 4,960,613, entitled "Laser Interconnect Process" by H. S. Cole, et al.; U.S. Pat. No. 4,884,222 entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al. and now abandoned; U.S. Pat. No. 4,882,200, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al. and now abandoned; U.S. Pat. No. 4,933,042, entitled "Method and Apparatus for Packaging Integrated Circuit Chips Employing a Polymer Film Overlay Layer" by C. W. Eichelberger, et al.; U.S. Pat. No. 4,897,153, entitled "Method of Processing Siloxane-Polyimides for Electronic Packaging Applications" by H. S. Cole, et al.; U.S. patent application Ser. No. 289,944, filed Dec. 27, 1988, entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski and now abandoned; U.S. patent application Ser. No. 363,646, filed June 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546, filed Dec. 21, 1989, entitled "Hermetic High Density Interconnected Electronic System" by W. P. Kornrumpf, et al.; U.S. patent application Ser. No. 07/457,127, filed Dec. 26, 1989, entitled "Enhanced Fluorescence Polymers and Interconnect Structures Using Them" by H. S. Cole, et al.; U.S. patent application Ser. No. 454,545, filed Dec. 21, 1989, entitled "An Epoxy/Polyimide Copolymer Blend Dielectric and Layered Circuits Incorporating It" by C. W. Eichelberger, et al.; application Ser. No. 07//504,760, filed Apr. 5, 1990, entitled, "A Building Block Approach to Microwave Modules", by W. P. Kornrumpf et al.; application Ser. No. 07/504,821, filed Apr. 5, 1990, entitled, "HDI Microwave Circuit Assembly", by W. P. Kornrumpf, et al.; application Ser. No. 07/504,750 filed Apr. 5, 1990, entitled, "An Ultrasonic Array With a High Density of Electrical Connections", by L. S. Smith, et al.; application Ser. No. 07/504,803, filed Apr. 5, 1990, entitled, "Microwave Component Test Method and Apparatus", by W. P. Kornrumpf, et al.; application Ser. No. 07/504,753, filed Apr. 5, 1990, entitled, "A Compact High Density Interconnected Microwave System", by W. P. Kornrumpf; application Ser. No. 07/504,769, filed Apr. 5, 1990, entitled, "A Flexible High Density Interconnect Structure and Flexibly Interconnected System" by C. W. Eichelberger, et al.; application Ser. No. 07/504,751, filed Apr. 5, 1990, entitled, "Compact, Thermally Efficient Focal Plane Array and Testing and Repair Thereof", by W. P. Kornrumpf, et al.; application Ser. No. 07/504,749, filed Apr. 5, 1990, entitled, "High Density Interconnect Structure with Top Mounted Components", by R. J. Wojnarowski, et al.; application Ser. No. 07/504,770, filed Apr. 5, 1990, entitled, "A High Density Interconnect Structure Including a Chamber", by R. J. Wojnarowski, et al.; and application Ser. No. 07/504,748, filed Apr. 5, 1990, entitled, "Microwave Component Having Tailored Operating Characteristics and Method of Tailoring" by W. P. Kornrumpf, et al. Each of these Patents and Patent Applications is incorporated herein by reference.

Any additional dielectric layers which are required for isolation between the first metallization layer and any subsequent metallization layers or for prevention of short circuits due to contact with external conductors are formed by spinning on or spraying on a solvent solution of a desired thermoplastic dielectric material. The structure is then baked to drive off the solvent in order to leave a solvent-free dielectric layer. Thereafter, via holes are formed as needed and a patterned metallization layer is formed thereover which is disposed in ohmic contact with underlying metal in the via holes. If needed, further thermoplastic dielectric and metallization layers are formed thereover in a similar manner. Unfortunately, there are a limited number of dielectric materials which are suitable for use as these upper dielectric layers because of all of the material properties they must exhibit. Not only must the dielectric material be available as a spin-on or spray-on solution, it must also provide good adhesion to the underlying dielectric and metallization and to the material of any overlying metallization or dielectric layer which may subsequently be formed thereon.

By a thermoplastic polymer material, we mean that upon multiple cycles of heating and cooling, the melting point of the polymer material remains substantially unchanged. That is, no substantial cross-linking of the material takes place during the heating, melting and resolidifying process. Such polymers are suitable as adhesive layers for bonding higher temperature materials, including polymers to substrates and may also themselves be used as layers to be bonded to substrates through the use of lower temperature adhesive layers. By a thermoset polymer material, we mean a polymer material in which cross-linking takes place the first time it is heated or during its preparation process, such that the material either no longer melts or melts at a much higher temperature than it did prior to its initial heating or its formation, as the case may be.

Microwave systems are often composed of monolithic microwave integrated circuits (MMICs), other active microwave devices such as GaAs transistors, passive microwave components and other non-microwave components such as logic and control structures.

A monolithic microwave integrated circuit or MMIC is an integrated circuit which is designed to operate at microwave frequencies. MMICs are normally fabricated in GaAs because of the much higher potential operating frequency which GaAs provides as compared to silicon. A typical MMIC may include one or more amplifiers, some passive components and one or more feedback loops which provide feedback from the output of an amplifier or circuit to establish a desired transfer function for that circuit.

It is known in the art to fabricate microwave systems from a variety of such components by providing a ceramic substrate having microstrip RF circuitry, DC supply lines (conductors), logic lines, control lines and contact pads fabricated thereon and by attaching devices and components such as MMICs, GaAs transistors, other microwave and supporting components to the substrate and connecting them to the circuitry on the substrate using wire bonds or tab interconnections.

Such fabrication techniques have a number of disadvantages. Thin and thick film methods of fabricating circuitry on ceramic substrates have tolerance limitations which prevent such structures from being produced with microwave characteristics which are repeatable with close tolerances. Consequently, there is substrate-to-substrate variation in the microwave characteristics of such nominally identical substrates. Further, the active microwave components such as MMICs and GaAs transistors themselves have fabrication tolerances which result in variations in operating characteristics from device to device. Further, in such structures, impedance discontinuities and mismatches are normal at the edges of MMICs and GaAs transistors. These impedance discontinuities vary with the actual placement of the chips on the surface of or in cavities in the ceramic substrate. This is because slight changes in the positioning of such devices change both the lengths of the gaps between the device and the substrate and the alignment of the device structure with the substrate structure. Further, these physical assembly tolerances result in variable interconnect bond lengths, resulting in variable inductances and consequently, varied circuit performance. These impedance mismatches also vary with actual component and substrate impedance values. Further, these and other fabrication-tolerance-induced differences in impedances result in reflections and other undesirable operational effects which degrade system operating characteristics. The cumulative effect of these differences is a wide range of system operating characteristics. Consequently, assembly of a microwave system from such components is a relatively low yield process in which many of the resulting systems do not meet specifications. A significant contributor to this low yield is the fact that many active microwave components cannot readily be accurately tested over their full expected operating frequency and power ranges in a non-destructive manner because of the difficulty of coupling such components to a test system. Consequently, many components which pass preassembly testing do not in reality meet specifications.

As the desired operating frequency of such microwave systems has increased from the neighborhood of 2 GHz to still higher frequencies in the range from 8 GHz to 16 GHz, or more, the problem of thin film and thick film fabrication tolerances and component testing have become ever more vexing.

Many MMICs and other active microwave devices include delicate structures which can easily be damaged or destroyed. These include conductors which are spaced from the surface of the GaAs by an air gap—a structure which is known as an "air bridge". Air bridges are used in these MMICs in order to provide the MMIC with particular desired operational characteristics. These delicate structures severely limit the assembly techniques which can be used to connect these devices into microwave systems. Further, such components are quite sensitive to the placement near their surfaces of conductors or dielectric materials having dielectric constants of more than one, especially in the vicinity of inductors, air bridges and field effect device gate regions.

The interconnection of microwave structures presents many problems, considerations and challenges not faced in the interconnection of digital systems. Use of microwave frequencies requires consideration of wave characteristics, transmission line effects, material properties at microwave frequencies, the presence of exposed delicate structures on MMICs and other components and system and component characteristics which do not exist at the lower operating frequencies of such digital systems. These considerations include the question of whether the dielectric materials are suitable for use at microwave frequencies, since materials which are good dielectrics at lower frequencies can be quite lossy or even conductive at microwave frequencies. Further, even if the dielectric is not lossy at microwave frequencies, its dielectric constant itself may be high enough to unacceptably modify the operating characteristics of MMICs, GaAs transistors and other microwave components or structures which might be interconnected using a high density interconnect structure. Since the first dielectric layer of this high density interconnect structure is applied by a lamination process involving the application of substantial pressure to the polyimide film, there is a substantial concern that air bridges and other delicate structures in microwave components may be damaged, destroyed or modified either by the lamination pressure causing them to collapse or by the infiltration of the thermoplastic adhesive into the air gap under the conductor, thereby modifying the dielectric properties of that gap, or even the mere presence of the dielectric unacceptably modifying the operating characteristics of some of the components.

Many of these devices are so sensitive to the presence of overlying dielectric layers that their manufactures do not even deposit glass passivation layers on the upper surface of those chips because even that thin dielectric layer would adversely affect the operating characteristics of the components. The use of glass passivating coatings on semiconductor chips is essentially universal in the silicon semiconductor art to prevent environmentally induced deterioration of the devices. Consequently, in the microwave art disposing any additional dielectric material on an active device or component is looked upon as a sure way to degrade performance and is assiduously avoided.

The Kapton polyimide typically used in this high density interconnect structure has the initial laminated dielectric layer as a dielectric constant of substantially 3.5. The ULTEM 1000 resin normally used as the thermoplastic adhesive for this Kapton layer has a dielectric constant of substantially 3.5. SPI siloxane polyimide which is typically used as the spin-on dielectric layer, has a dielectric constant of 2.7-2.9.

Use of a lower dielectric constant material as the dielectric layers of such a high density interconnect structure would reduce the capacitive loading and coupling experienced by the integrated circuit chips which the system interconnects and would also reduce the RC time constant of the conductive runs within the high density interconnect structure.

The polyimide and polyetherimide materials used in fabrication of the high density interconnect structure discussed above have excellent adhesion properties for semiconductor chips and metallization runs. These materials are also laser ablatable at 351 nm as has been discussed above.

The best known low dielectric constant polymer is the fluoropolymer, Teflon, available from DuPont Chemicals. The low dielectric constant of Teflon would make it attractive for use as a dielectric layer in a high density interconnect structure intended for operation at high frequencies. Unfortunately, Teflon exhibits a number of properties which mitigate against its use as the dielectric layer in a high density interconnect structure. First, Teflon is substantially transparent to 351 nm light and available Teflon film are opaque. Consequently, Teflon cannot be laser drilled at 351 nm. Second, an opaque film is unusable in a high density interconnect structure because of the need to be able to see through the dielectric layer for alignment and other purposes. Third, the adhesion properties of metal layers disposed on Teflon are uncertain, but the known non-stick properties of Teflon make such adhesion doubtful.

DuPont has recently made Teflon available as an amorphous fluoropolymer which can be deposited from a solvent solution. The resulting film is substantially transparent, which overcomes the drawback of previously available films of not being able to see the underlying structure through the film. However, this does not solve the other drawbacks of the Teflon films.

The problem of laser non-ablatability of the amorphous Teflon at 351 nm can be overcome by including an appropriate dye in the solvent Teflon solution as taught in application Ser. No. 456,421, entitled "Laser Ablatable Polymer Dielectrics and Methods" which is listed above or by using a different laser frequency. However, the problem of adhesion would still not be solved.

Consequently, there is a need for a low dielectric constant polymer dielectric material for use in high density interconnect structures which provides good adhesion, both to an underlying portion of the structure and to an overlying portion of the structure.

OBJECTS OF THE INVENTION

Accordingly, a primary object of the present invention is to provide dielectric layers in a high density interconnect structure which exhibit the desirable processing properties of the polyimide and polyetherimide materials while exhibiting a lower dielectric constant.

Another object of the present invention is to provide a low dielectric constant polymer dielectric layer including Teflon which is laser ablatable.

Another object of the present invention is to provide a low dielectric constant dielectric layer exhibiting the adhesion properties of polyimides in combination with a reduced dielectric constant.

Another object of the present invention is to provide dielectric layers in a high density interconnect structure which are comprised of a plurality of alternating sublayers having different polymer compositions and different dielectric constants.

Another object of the present invention is to provide a laminatable dielectric layer comprised of a plurality of sublayers of alternating composition.

Another object of the present invention is to provide a multi-sublayer dielectric layer having sublayers of alternating composition which are formed by spinning on solutions containing the polymer material or its precursor.

SUMMARY OF THE INVENTION

The above and other objects which will become apparent from the specification as a whole, including the drawings, are accomplished in accordance with the present invention by providing a dielectric layer in a high density interconnect structure which is comprised of a plurality of sublayers. Two different compositions are employed for the sublayers and the compositions alternate in a stack. One of these compositions is preferably a fluoropolymer and the other is preferably a polyimide. Preferably the stack is provided with polyimide sublayers as both exterior surfaces of the stack to provide the dielectric layer with the known adhesion properties of the polyimide.

Dielectric layers of this type may be formed in accordance with one embodiment of the invention by stacking alternate polyimide and fluoropolymer films to the desired thickness and then heating the stack under pressure to above the glass transition temperature $T_g$ of the lower $T_g$ material to bond the stack into a unitary dielectric layer. Alternatively, the dielectric layer may be formed in situ by spinning on first a polyimide layer, drying that layer, spinning a fluoropolymer layer, drying that layer, spinning on another polyimide layer, and so forth, until the desired thickness of the dielectric layer is obtained.

For laser drilling, it is preferred that pure fluoropolymer sublayers be no thicker than 4-5 μm. This laminated dielectric layer may be laser drilled by directing the laser at the dielectric layer in the same manner as would be done with all polyimide dielectric layer. The laser light passes through the fluoropolymer substantially without absorption and without ablative effect. However, when absorbed in the underlying polyimide layer, the laser light heats that layer to a sufficient temperature to ablate both that layer and the overlying fluoropolymer layer with the result that this multi-sublayer dielectric layer may be laser drilled in the same manner as previous, all-polyimide, dielectric layers have been drilled.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
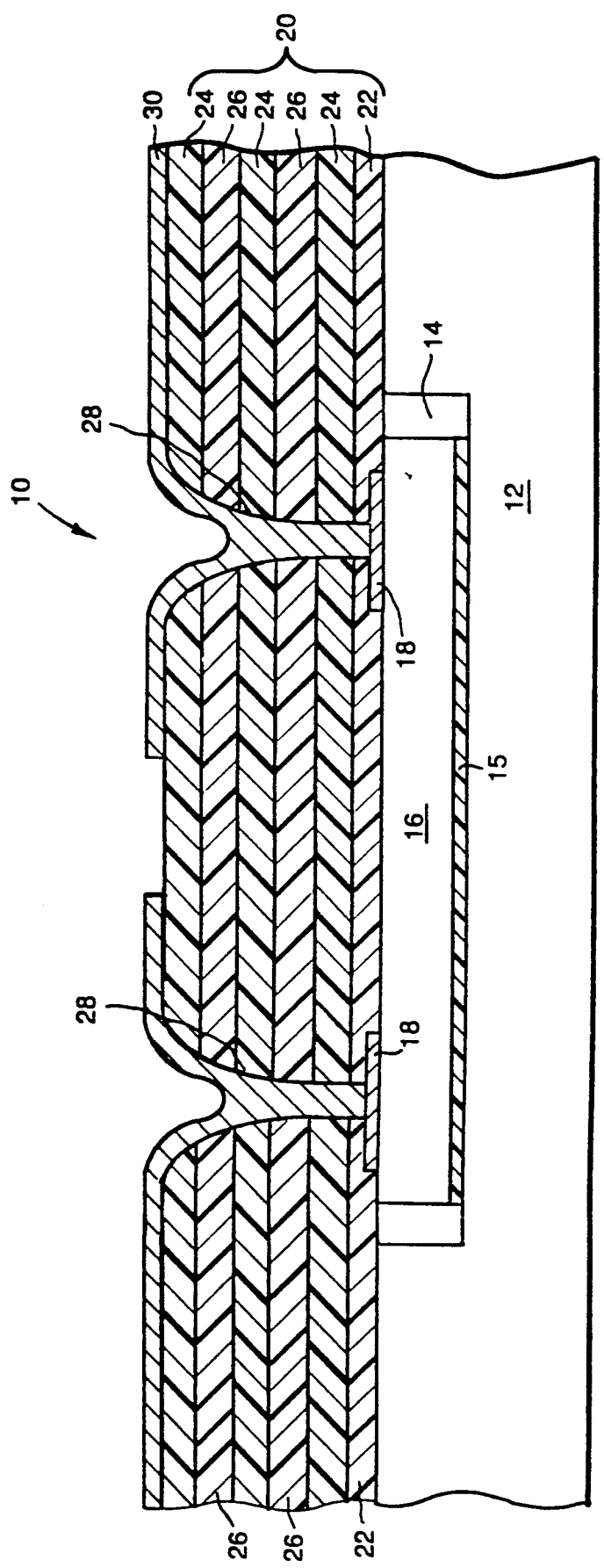
FIG. 1 is a cross-section illustration of a high density interconnect structure incorporating a dielectric layer in accordance with the present invention.

A high density interconnect structure 10 incorporating a dielectric layer in accordance with the present invention is illustrated in cross section in FIG. 1. The high density interconnect structure 10 comprises a carrier or substrate 12 having a cavity 14 therein in which one or more semiconductor chips 16 are bonded by a thermoplastic adhesive layer 15. The semiconductor chip 16 has contact pads 18 disposed on their upper surface. A dielectric layer 20 in accordance with the present invention is disposed on top of the semiconductor chip 16, its contact pads 18 and the upper surface of the substrate 12. The dielectric layer 20 comprises a stack of alternating sublayers 24 and 26 which are bonded to each other. As illustrated, both the upper and lower surfaces of the laminate stack are preferably sublayers 24. This laminated stack is bonded to the upper surface of the substrate, the chip and its contact pads by a thermoplastic adhesive layer 22 which may preferably be ULTEM 1000 resin available from General Electric Company, but in the alternative may be any of a variety of the thermoplastic adhesives disclosed in application Ser. No. 07/546,964, entitled "High Temperature Polyether Imide Coating Compositions and Method of Making". The sublayers 24 are preferably a polyimide material and in accordance with one embodiment of the invention, may be Kapton polyimide available from E. I. DuPont de Nemours, Inc. The sublayers 24 are preferably each between 0.5 and 5 μm thick. Interleaved with the sublayers 24 are the sublayers 26 which are preferably a fluoropolymer preferably between 0.5 and 1-2 μm thick. The multi-sublayer dielectric layer 20 may preferably be laminated to the chip and substrate in the manner taught in the background patents by heating the substrate and the dielectric layer to above the glass transition temperature $T_g$ of the thermoplastic adhesive 22 and applying pressure to bond the dielectric layer to the substrate and chips. Thereafter, the via holes 28 in the dielectric layer 20 are drilled with a laser. This laser drilling is successful despite the fact that the fluoropolymer sublayers 26 are transparent to the laser wavelength and thus are not directly ablatable by it. We have successfully drilled 1 μm thick layers of AF1600 disposed on Kapton® polyimide, available from E. I. du Pont de Nemours Company at laser wavelengths of 266 nm and 193 nm, whereas AF1600 layers 4-5 μm thick did not ablate. AF1600 is an amorphous fluoropolymer available from DuPont Chemicals. This successful ablation of the AF1600 is a result of the thinness of the fluoropolymer layers which enable sufficient heat transfer from the underlying polyimide sublayer 24 (which does absorb the laser wavelength) to cause thermal decomposition, bond breaking or ablation in the directly overlying portion of the fluoropolymer sublayer with the result that the via hole may be drilled to the contact pad 18. It is preferred that the bottom sublayer 24 of the stack dielectric layer be a polyimide in order to ensure the absorption of the laser beam under the lowest fluoropolymer layer 26 and good adhesion to the adhesive layer 22. However, even if the bottom sublayer of the stacked dielectric layer were a fluoropolymer sublayer, then the underlying thermoplastic adhesive 22 could provide the same ablation assistance effect as the polyimide layer 24 does in the preferred embodiment.

The uppermost sublayer of the stacked dielectric layer is preferably a polyimide sublayer 24 in order to provide the known adhesion characteristics of the polyimide material for the metal 30 of the overlying conductive layer. After completion of the via holes, the structure is coated with the metal layer 30, preferably by sputtering titanium over the structure followed by sputtering a thin copper layer followed by electroplating a thicker copper layer. The structure is then coated with a photoresist material which is patterned by laser writing or through a mask and the unneeded portion of the metal 30 is then etched away. Thereafter, the remaining photoresist is removed in an appropriate organic solvent.

The structure illustrated in FIG. 1 may be used as a single level interconnection high density interconnect structure. In this specification, the term "dielectric layer" is used to identify that dielectric material which is disposed between two different levels of conductors. Thus, the entire stack of sublayers 24 and 26 along with the adhesive sublayer 22 form a single dielectric layer 20.

Figure 2:
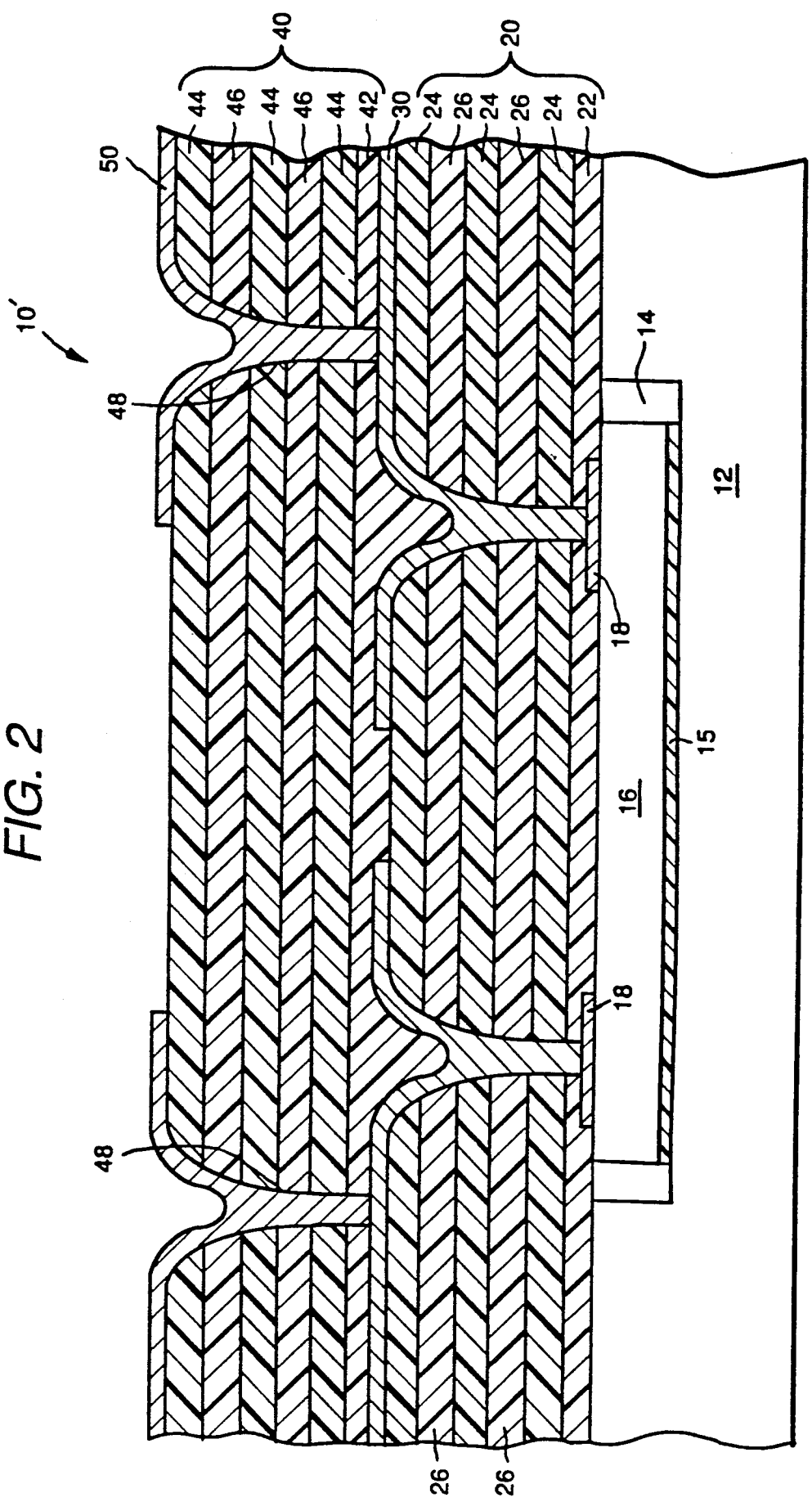
FIG. 2 is a cross-section illustration of a high density interconnect structure incorporating two dielectric layers in accordance with the present invention.

FIG. 2 illustrates in cross-section a two level high density interconnect structure in which both dielectric layers are in accordance with the present invention. The high density interconnect structure 10' begins with the structure 10 as illustrated in FIG. 1 and has a second stacked dielectric layer 40 laminated thereover. The stacked dielectric layer 40 comprises a plurality of polyimide sublayers 44 and a plurality of fluoropolymer sublayers 46. This stacked dielectric layer is bonded to the underlying structure 10 by thermoplastic adhesive 42. The thermoplastic adhesive 42, in combination with the sublayers 44 and 46, form the dielectric layer 40. In accordance with the related application Ser. No. 07/546,963 entitled "Multiple Lamination High Density Interconnect Process and Structure Employing Thermoplastic Adhesives Having Sequentially Decreasing $T_g$'s" the thermoplastic 42 preferably has a glass transition temperature $T_g$ which is lower than the glass transition temperature $T_g$ of the thermoplastic adhesive 22 in order that the dielectric layer 40 may be laminated onto the structure 10 without adverse effect on the interconnections provided by that first layer high density interconnect structure. Following lamination of the dielectric layer 40, via holes 48 are laser drilled in the dielectric layer 40 in the same manner as has been described above in connection with the structure 10. Thereafter, the dielectric layer 40 is metallized with a metal layer 50 and that layer is patterned to provide the individual conductors needed in the second conductive level of this two level high density interconnect structure.

Additional dielectric layers and conductive layers may be provided on the structure 10' in accordance with the present invention by laminating another dielectric layer using a still lower $T_g$ thermoplastic adhesive at each level.

Figure 3:
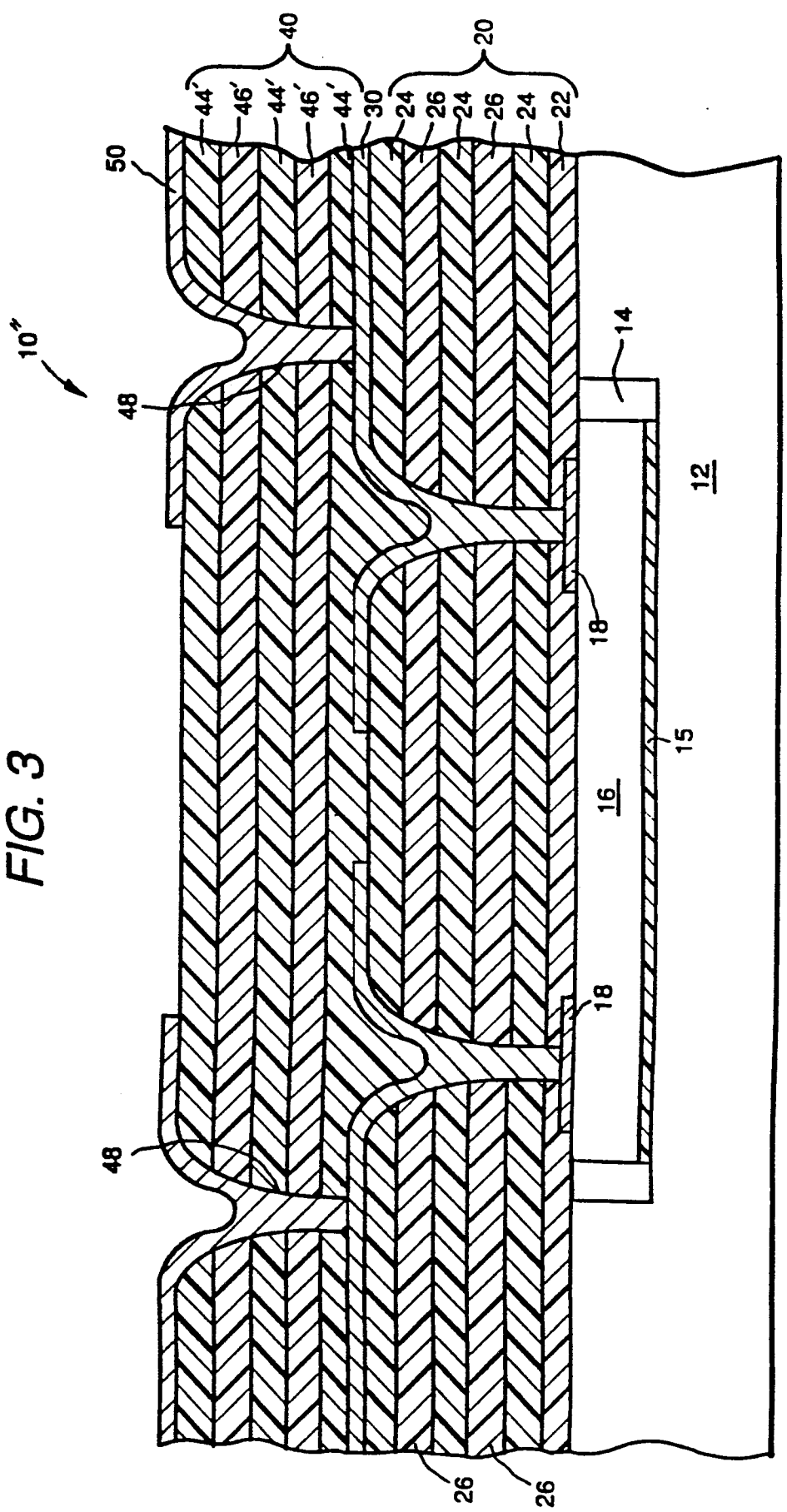
FIG. 3 is a cross-section illustration of an alternative embodiment of a high density interconnect structure incorporating two dielectric layers in accordance with the present invention.

An alternative embodiment of a multi-level high density interconnect structure in accordance with the present invention is illustrated at 10" in FIG. 3. The structure illustrated in FIG. 3 is similar to the structure illustrated in FIG. 2 in both its structure and its effect. However, it lacks the thermoplastic adhesive layer 42 of the FIG. 2 structure. The multi-sublayer dielectric layer 40' is formed by spinning on the first sublayer 44' of that dielectric layer from a source solution. The structure is then baked to drive off the solvent of the solution and in the event that the polymer involved is not fully imidized, to imidize that polymer to render it insoluble. Next, a source solution for the sublayer 46' is spun on the structure and the structure is baked to drive out the solvent. The second sublayer 44' is then spun on and baked. This process continues until all of the sublayers have been provided. When the stacked dielectric layer 40' is complete, the via holes 48' are laser drilled in the structure, the structure is metallized and the metal is patterned in the manner described previously in connection with the FIG. 2 structure.

Polyamic acid available from DuPont may be used as the precursor of the dielectric sublayer 44'. The polyamic acid is preferably baked at a temperature between 200° C. and 250° C. in order to drive off its solvent and to imidize the polyamic acid to provide an insoluble polyimide layer. Imidization is a process in which the chemical structure of the polyamic acid is changed by the elimination of water molecules into a structure which is substantially insoluble.

As an alternative to the polyamic source material, the polymer source material XU-218 available from Ciba-Geigy may be used. The XU-218 material may be baked at a lower temperature than the polyamic acid source material since the XU-218 is fully imidized and is soluble in lower temperature solvents than the polyamic acid. Still further, photosensitive polyimides may be employed. Photosensitive polyimides are spun on in a similar fashion and may be either fully imidized or not yet imidized with a consequent difference in their bakeout temperatures. Other polyimides such as fluorinated polyimides, siloxane-polyimides, and polyetherimides are also suitable for use as the absorbing source material. In addition, other classes of polymers such as benzocyclobutene polymers, polyesters, and epoxies which are substantially absorbing or can have their absorbance substantially modified as disclosed in U.S. patent application Ser. No. 456,421, "Laser Ablatable Polymer Dielectrics and Methods" can be utilized.

The preferred source material at this time for the fluoropolymer sublayers 46' is the amorphous fluoropolymer AF1600 or AF2400 available from DuPont Chemicals. The solvent used for spinning on this material (Fluorinert FC-75 available from DuPont) may be baked out at 150° C. and thus, does not present a temperature problem for a typical high density interconnect structure.

The structure in accordance with the present invention exhibits some of the best properties of each of the materials included in the stack. With the polyimide as the top and bottom sublayers of the stack, good adhesion is provided both to the underlying structure and to any overlying metal or dielectric layer. The presence of the fluoropolymer reduces the dielectric constant of the stacked dielectric layer substantially relative to the dielectric constant of an all polyimide dielectric layer. AF1600 has a reported dielectric constant of 1.93. Thus, the effective dielectric constant of a multi-sublayer stack in accordance with the present invention should be between 1.93 and the dielectric constant of the other material employed in the stack, which will typically have a dielectric constant in the range from about 2.7 to 3.5.

As an alternative to laser drilling individual via holes with a scanned laser beam, the structure may be masked with a metal mask and an excimer laser may be used to etch the via holes in openings in the metal mask.

Figure 4:
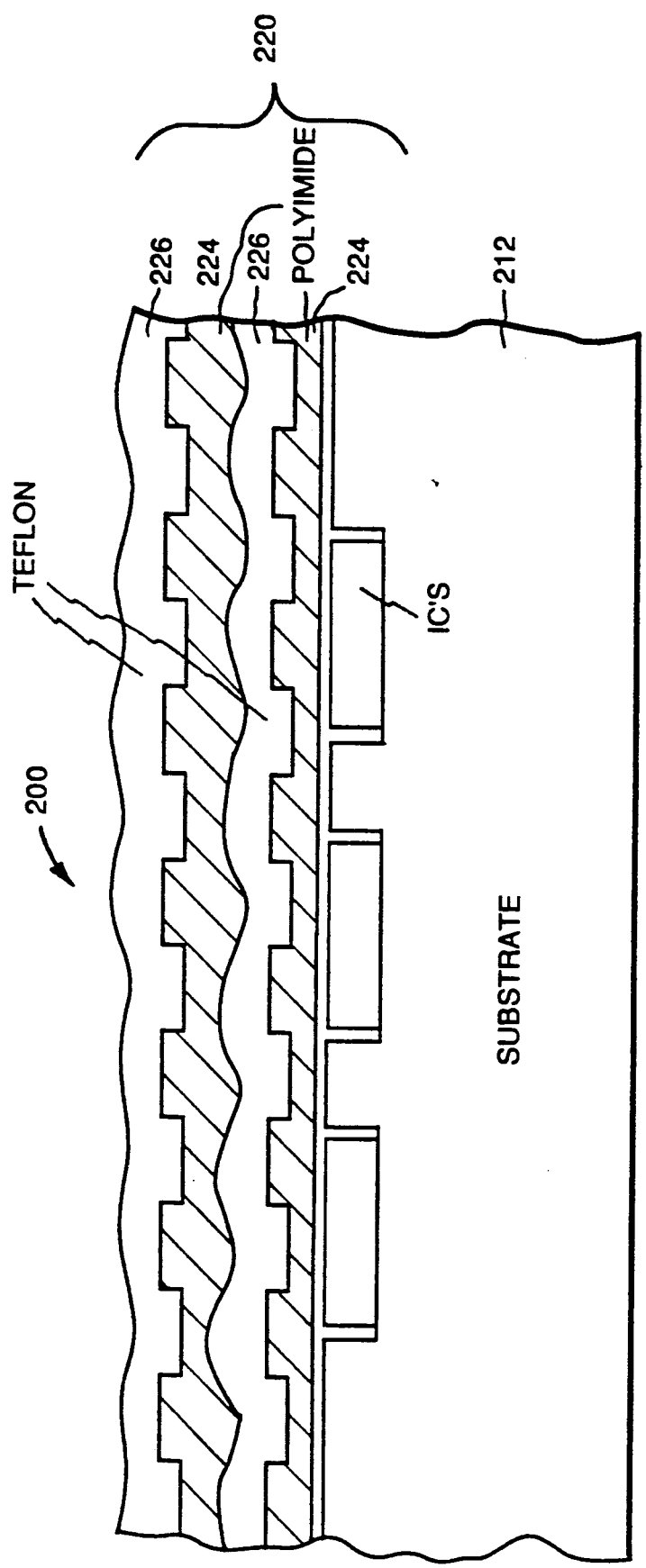
FIG. 4 is a cross-section illustration of an alternative embodiment of a high density interconnect structure incorporating two dielectric layers having grooved sublayers in accordance with the present invention

FIG. 4 illustrates a further alternative high density interconnect structure in accordance with the present invention. The structure 200 is similar to the structures 10, 10' and 10", but differs in that rather than the sublayers having a substantially constant thickness, the sublayers 224 and 226 have a grooved configuration which provides the multisublayer dielectric layer 220 of structure 200 with a greater percentage of the fluoropolymer than in the structure of FIGS. 1–3. The initial polyimide sublayer 226 has a smooth lower surface, but a grooved upper surface. This grooved upper surface may be provided by using a photosensitive polyimide which is exposed in a manner to leave the photosensitive polyimide, which occupied the grooves when the layer was a smooth layer, soluble with the result that material is washed out, leaving the grooves. A layer 226 of the fluoropolymer is then spun on over this structure, dried and baked. This results in greater thicknesses of the fluoropolymer in the grooves of the first polyimide sublayer. After drying and baking, a subsequent polyimide sublayer 224 is spun on, dried and patterned to provide grooves disposed over the ridges of the next lower polyimide sublayer. Thereafter, a further fluoropolymer sublayer 226 is spun on, dried and baked.

The stacked dielectric layer 20 of FIG. 1 may be formed by stacking preformed films of the polyimide material and the fluoropolymer material, applying pressure to them and heating them to above the glass transition temperature $T_g$ of the lower $T_g$ material and then allowing the stack to cool. After the stack has cooled, the layers are bonded to each other to provide a single unitary structure.

Figure 5:
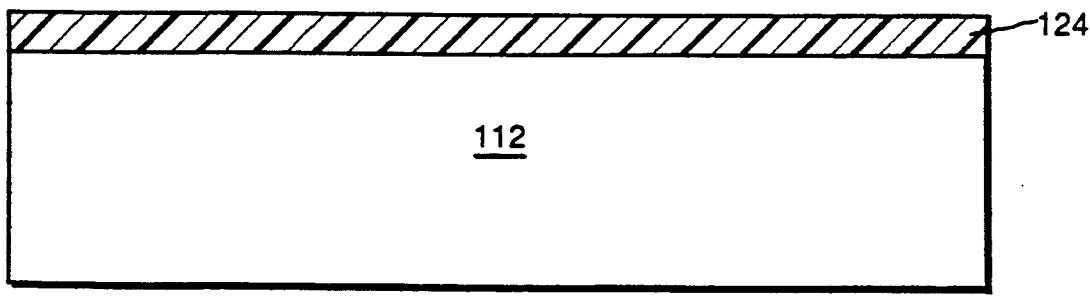
FIGS. 5-10 are cross-section views illustrating sequential steps in the process of forming a multi-sublayer dielectric layer in accordance with the present invention.
Figure 6:
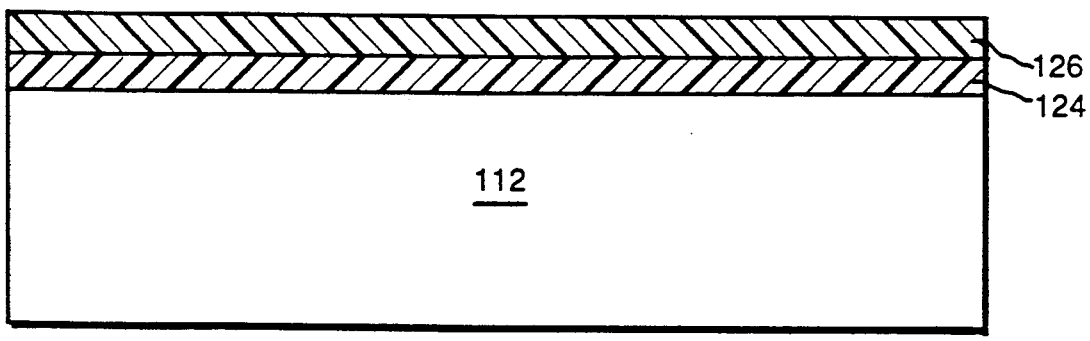

Another process for forming the multilayer stack is illustrated in FIGS. 5-10. The process begins with a support substrate 112 on which a solution of the first polymer dielectric material is spun on and dried to form a first sublayer 124. This sublayer is baked to drive off any solvent and in the event that the material is not fully imidized, to imidize that material. This structure is shown in FIG. 5.

Thereafter, a source solution of the first fluoropolymer sublayer is spun on top of the first polyimide sublayer 124. This fluoropolymer source solution is dried and baked to drive off the solvent to provide the structure illustrated in FIG. 6.

Figure 7:
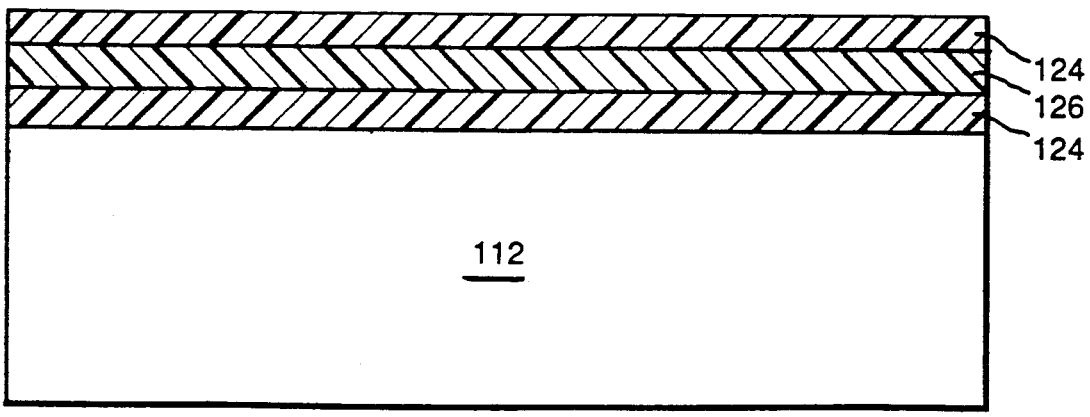

Thereafter, as illustrated in FIG. 7, a second polyimide sublayer 124 is spun on, dried and baked.

Figure 8:
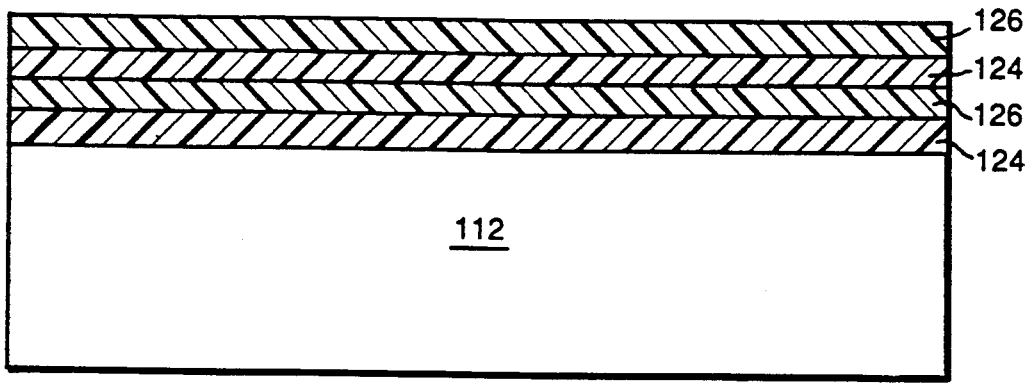

As shown in FIG. 8, a second fluoropolymer sublayer is then spun on, dried and baked.

Figure 9:
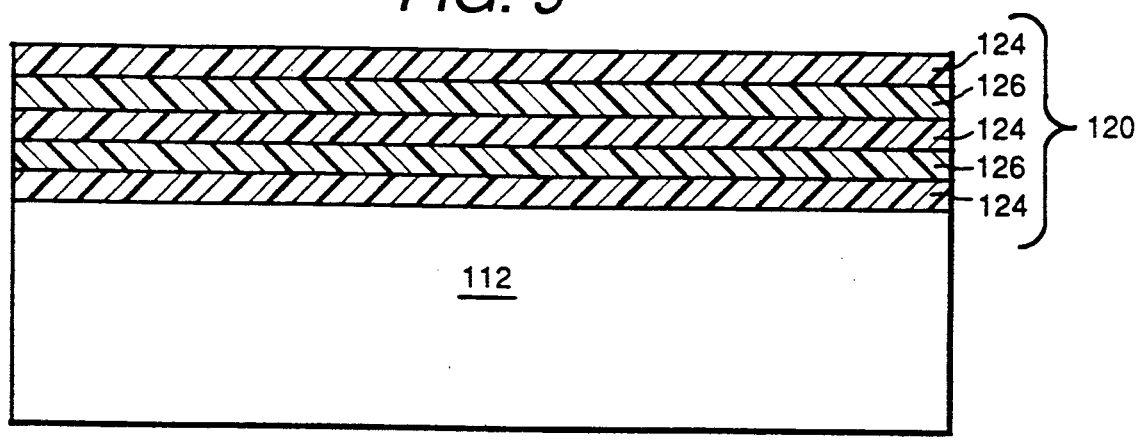

A final polyimide sublayer is spun on, dried and baked to provide the structure illustrated in FIG. 9 where a five sublayer stack is desired. Where more sublayers are desired, the process continues until the desired number of sublayers are present.

Figure 10:
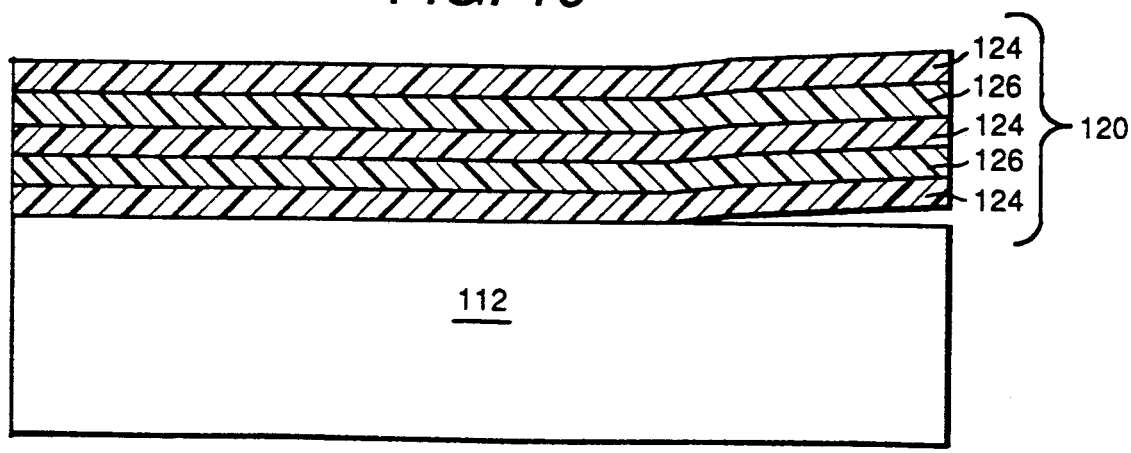

Thereafter, as illustrated in FIG. 10, the stacked dielectric layer 120 is separated from its support substrate 112. This may be done in a number of ways. One simple way is to provide a soluble layer between the substrate 112 and the first sublayer 124 of the dielectric layer 120. This soluble layer may then be dissolved out of the structure to separate the dielectric layer 120 from the substrate 112. Alternatively, the substrate 112 may be dissolved or etched to remove it from the dielectric layer 120. Other techniques may also be used. This stacked dielectric layer 120 is then ready for lamination to a high density interconnect structure in the manner which has been described. This stacked dielectric layer may also be used in other applications.

While in the figures two fluoropolymer sublayers are illustrated in each stacked dielectric layer, it should be understood that as few as one fluoropolymer sublayer may be employed and any desired total number of sublayers may be employed with a consequent increase in the number of fluoropolymer sublayers.

It should be understood that although the sublayers 24 and 26 are illustrated as being substantially the same thickness, they may, instead of being substantially the same thickness, differ in thickness by a substantial amount. An upper limit on the fluoropolymer sublayer's thickness is just enough less than the full height of the stacked dielectric layer to enable the polyimide outer sublayers 24 to be included in the stack. In this situation, the stacked dielectric layer will not be ablatable at 351 nm for a sufficiently thick stack dielectric layer. However, that stack structure may be laser drilled at other laser wavelengths (e.g. 193 nm) where the fluoropolymer layer is substantially absorbing. In addition, via holes may be formed using a metal masking process and reactive ion etching (RIE). When RIE is used to form the via holes, the thickness limitations on the fluoropolymer layer which are imposed by laser ablation may be ignored. Consequently, no thickness limitations are inherent to the invention.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A dielectric layer comprising a stack of sublayers, said stack comprising:
   a plurality of first sublayers consisting of a first dielectric composition which is a polyimide;
   a plurality of second sublayers consisting of a second dielectric composition which is a fluorocarbon; and
   said first and second sublayers alternating in said stack and being bonded to each other.

2. The dielectric layer recited in claim 1 wherein:
   said first dielectric composition has a first dielectric constant and said second dielectric composition has a second dielectric constant and said first dielectric constant is different than said second dielectric constant.

3. The dielectric layer recited in claim 2 wherein:
   said second dielectric constant is lower than said first dielectric constant.

4. The dielectric layer recited in claim 1 wherein:
   said stack has first sublayers exposed at both the top and bottom of said stack.

5. The dielectric layer recited in claim 1 wherein:
   the composition of said first sublayer is laser ablatable at a given laser frequency;
   the composition of said second sublayer is not itself laser ablatable at said given frequency; and
   said second sublayers are thin enough that said dielectric layer is laser ablatable at said given laser frequency.

6. The dielectric layer recited in claim 5 wherein:
   said second sublayers have a thickness of less than several micrometers 7. The dielectric layer recited in claim 1 wherein:
   all of said first sublayers have substantially the same thickness; and
   all of said second sublayers have substantially the same thickness.

8. The dielectric layer recited in claim 7 wherein:
   said first and second sublayers are substantially the same thickness.

9. A dielectric layer comprising a stack of sublayers, said stack comprising:
   a plurality of first sublayers consisting of a first dielectric composition which is laser ablatable at a given laser frequency;
   a plurality of second sublayers consisting of a second dielectric composition which is not itself laser ablatable at said given laser frequency;
   said first and second sublayers alternating in said stack and being bonded to each other; and
   said second sublayers being thin enough that said dielectric layer is laser ablatable at said given laser frequency.

10. The dielectric layer recited in claim 9 wherein:
    said second sublayers have a thickness of less than several micrometers 11. The dielectric layer recited in claim 9 wherein:

said first and second sublayers are substantially the same thickness.

12. A high density interconnect structure comprising:
an electronic component having contact pads on a first surface thereof;
an interconnection structure over said electronic component including a first layer of organic polymer dielectric material disposed on and bonded to said electronic component, said first layer of organic polymer dielectric material having apertures therein disposed in alignment with at least selected ones of said contact pads;
a first patterned conductive layer disposed on said first dielectric layer and extending into said apertures in said first dielectric layer into ohmic contact with said selected ones of said contact pads; and
said first layer of dielectric material comprising a first stack including:
a plurality of first sublayers consisting of a first dielectric composition,
at least one second sublayer consisting of a second dielectric composition, and
said first and second sublayers alternating in said first stack and being bonded to each other.

13. The high density interconnect structure recited in claim 12 wherein:
said first layer of dielectric material further comprises a thermoplastic adhesive sublayer disposed between said stack and said electronic component and bonding said stack to said electronic component.

14. The high density interconnect structure recited in claim 13 which further comprises:
a second layer of organic polymer dielectric material disposed on and bonded to said first patterned conductive layer and exposed portions of said first layer of dielectric material, said second dielectric layer comprising:
a second stack including
a plurality of first sublayers consisting of a first dielectric composition,
at least one second sublayer consisting of a second dielectric composition, and
said first and second sublayers alternating in said second stack and being bonded to each other, and
a thermoplastic adhesive sublayer disposed between said second stack and said first patterned conductive layer and exposed portions of said first layer of dielectric material and bonding said second stack thereto;
said second layer of organic polymer dielectric material having apertures therein disposed in alignment with selected portions of said first patterned conductive layer; and
a second patterned conductive layer disposed on said second dielectric layer and extending into said apertures in said second dielectric layer into ohmic contact with said selected portions of said first patterned conductive layer.

15. The high density interconnect structure recited in claim 13 wherein:
said first dielectric composition has a first dielectric constant and said second dielectric composition has a second dielectric constant and said first dielectric constant is different than said second dielectric constant.

16. The high density interconnect structure recited in claim 15 wherein:
said second dielectric constant is lower than said first dielectric constant.

17. The high density interconnect structure recited in claim 13 wherein:
said stack has first sublayers exposed at both the top and bottom of said stack.

18. The high density interconnect structure recited in claim 13 wherein:
said first sublayer is a polyimide; and
said second sublayer is a fluorocarbon.

19. The high density interconnect structure recited in claim 18 wherein:
the composition of said first sublayer is laser ablatable at a given laser frequency;
the composition of said second sublayer is not itself laser ablatable at said given frequency; and
said second sublayers are thin enough that said dielectric layer is laser ablatable at said given laser frequency.

20. The high density interconnect structure recited in claim 19 wherein:
said second sublayers have a thickness of less than several micrometers.

21. The high density interconnect structure recited in claim 13 which further comprises:
a second layer of organic polymer dielectric material disposed on and bonded to said first patterned conductive layer and exposed portions of said first layer of dielectric material, said second dielectric layer comprising a second stack including:
a plurality of first sublayers consisting of a first dielectric composition,
at least one second sublayer consisting of a second dielectric composition, and
said first and second sublayers alternating in said stack and being bonded to each other;
said second layer of organic polymer dielectric material having apertures therein disposed in alignment with selected portions of said first patterned conductive layer; and
a second patterned conductive layer disposed on said second dielectric layer and extending into said apertures in said second dielectric layer into ohmic contact with said selected portions of said first patterned conductive layer.

22. The high density interconnect structure recited in claim 12 wherein:
said first dielectric composition has a first dielectric constant and said second dielectric composition has a second dielectric constant and said first dielectric constant is different than said second dielectric constant.

23. The high density interconnect structure recited in claim 22 wherein:
said second dielectric constant is lower than said first dielectric constant.

24. The high density interconnect structure recited in claim 12 wherein:
said stack has first sublayers exposed at both the top and bottom of said stack.

25. The high density interconnect structure recited in claim 12 wherein:
said first sublayer is a polyimide; and
said second sublayer is a fluorocarbon.

26. The high density interconnect structure recited in claim 12 wherein:

the composition of said first sublayer is laser ablatable at a given laser frequency;

the composition of said second sublayer is not itself laser ablatable at said given frequency; and said second sublayers are thin enough that said dielectric layer is laser ablatable at said given laser frequency.

27. The high density interconnect structure recited in claim 26 wherein:

said second sublayers have a thickness of less than several micrometers.

28. A high density interconnect structure comprising:

an electronic component having contact pads on a first surface thereof;

an interconnection structure over said electronic component including a first layer of organic polymer dielectric material disposed on and bonded to said electronic component, said first layer of organic polymer dielectric material having apertures therein disposed in alignment with at least selected ones of said contact pads;

a first patterned conductive layer disposed on said first dielectric layer and extending into said apertures in said first dielectric layer into ohmic contact with said selected ones of said contact pads;

a second layer of organic polymer dielectric material disposed on and bonded to said first patterned conductive layer and exposed portions of said first layer of dielectric material;

said second layer of organic polymer dielectric material having apertures therein disposed in alignment with at least selected portions of said first patterned conductive layer;

a second patterned conductive layer disposed on said second dielectric layer and extending into said apertures in said second dielectric layer into ohmic contact with said selected portions of said first patterned conductive layer; and at least one of said dielectric layers comprising a stack including:

a plurality of first sublayers consisting of a first dielectric composition, a plurality of second sublayers consisting of a second dielectric composition, and said first and second sublayers alternating in said stack and being bonded to each other.

* * * * *